United States Patent

[11] 3,548,078

[72] Inventors Cord Albrecht
Erlangen;
Hans Lamatsch, Nurnberg, Germany
[21] Appl. No. 847,918
[22] Filed Aug. 6, 1969
[45] Patented Dec. 15, 1970
[73] Assignee Siemens Aktiengesellschaft
Berlin and Munich, Germany
a corporation of Germany
[32] Priority Aug. 7, 1968
[33] Germany
[31] No. P1765917.5

[54] BAND-SHAPED CONDUCTOR OF SUPERCONDUCTORS EMBEDDED IN A NORMAL CONDUCTOR

15 Claims, 4 Drawing Figs.

[52] U.S. Cl. 174/128, 29/599, 174/129, 335/216
[51] Int. Cl. H01v 11/08
[50] Field of Search 174/SC, 126, 128, 129; 335/216, 29/599

[56] References Cited

UNITED STATES PATENTS 3,332,047 7/1967 Borchert 174/126X

*Primary Examiner*—E. A. Goldberg
*Attorneys*—Curt M. Avery, Arthur E. Wilfond, Herbert L. Lerner and Daniel J. Tick

ABSTRACT: A band-shaped conductor comprises a plurality of adjacent single conductors electron beam welded to each other along welding seams therebetween. Each of the single conductors comprises normal conducting material and a plurality of superconductors embedded in the normal conducting material. The superconductors are spaced from the edges of the welding seams by at least several tenths of a millimeter.

BAND-SHAPED CONDUCTOR OF SUPERCONDUCTORS EMBEDDED IN A NORMAL CONDUCTOR

DESCRIPTION OF THE INVENTION

The present invention relates to a band-shaped conductor. More particularly, the invention relates to a band-shaped conductor of superconductors embedded in a normal conductor.

Conductors comprising superconducting metals and normal conducting metals having a high electrical conductivity at operating temperatures of the windings, are known as stabilized conductors and have been found to be suitable for the construction of superconducting magnet windings. In order to obtain good electrical stability for the windings, the cross section and the electrical conductivity of the normal conducting metal at low temperatures should be such that the assembled conductor is devoid of notable current degradation when the winding is properly cooled and that the current passing through said superconductor may be taken over completely or partly by the normal conducting metal, when the superconductor is transferred to the critical state by exceeding the critical current, so that the transition of the superconductor from a superconducting state to a normal conducting state occurs continually and reversibly and the superconducting state may be reestablished by a negligible reduction in the current.

In known types of band-shaped conductors or tape-shaped conductors, comprising superconducting material and normal conducting material, a plurality of superconducting wires, extending parallel to each other and comprising niobium-zirconium or niobium-titanium, are embedded in a copper band. Large superconducting magnets having disc-shaped windings and operating currents of 1000 amperes and greater, require band-shaped conductors having widths which are considerably greater than their thickness, to the extend of 20 or 30 times greater, and simultaneously have a relatively large cross section. The manufacture of such band-shaped conductors from a compact piece of material entails considerable difficulties and is possible, if at all, only with considerable and expensive machinery, due to the great quantities of normal conducting metal to be treated. The normal conducting metal must be so well affixed to the superconductors that only negligibly slight transition resistances will occur between the normal conducting metal and the superconducting material.

Additional difficulties occur in multicore conductors, which have particularly low transition resistances, and are therefore particularly preferable. The multicore conductors are manufactured by packing together copper and a plurality of niobium-titanium wires and forming them into a band by a sequence of cold-forming and heat-processing steps which reduce the cross section. The additional difficulties arise from the fact that the ratio between the thickness and the width of the band-shaped conductor cannot be arbitrarily decreased, since the extreme degrees of deformation which would be required to produce conductors having considerable width relative to their thickness would also press the niobium-titanium wires into great widths. The result would be a strongly anisotropic behavior in the magnetic field. That is, there would be a great dependency of the critical current of the superconductors on the direction of the magnetic field which acts upon the band-shaped conductor. These anisotropies may have a considerable detrimental effect upon the turns of the magnetic windings.

The principal object of the present invention is to provide a new and improved band-shaped conductor of superconductors embedded in a normal conductor.

An object of the present invention is to provide a band-shaped conductor of superconductors embedded in a normal conductor which eliminates the difficulties of known types of band-shaped conductors.

An object of the present invention is to provide a band-shaped conductor of superconductors embedded in a normal conductor which may be manufactured of prefabricated single conductors with less width and greater length.

An object of the present invention is to provide a band-shaped conductor of superconductors embedded in a normal conductor comprising a plurality of single conductors each having a thickness to width ratio which is relatively large, thereby eliminating the need for extreme deformation during the manufacture of the single conductors and therefore preventing possible pressing of the superconductors.

An object of the present invention is to provide a band-shaped conductor of superconductors embedded in a normal conductor comprising a plurality of single conductors electron beam welded to each other to provide good electrical and mechanical connection between the single conductors without permitting sufficient heat penetration into the normal conducting material to heat the embedded superconducting material to an undesirable extent.

An object of the present invention is to provide a band-shaped conductor of superconductors embedded in a normal conductor, of which the composition of the single conductors may be adjusted with facility to the local magnetic field within a winding produced from the conductor.

An object of the present invention is to provide a band-shaped conductor of superconductors embedded in a normal conductor which provides a possibility for saving considerable superconducting material.

An object of the present invention is to provide a band-shaped conductor of superconductors embedded in a normal conductor which permits considerable increases in the speed of welding the single conductors to each other.

An object of the present invention is to provide a band-shaped conductor of superconductors embedded in a normal conductor which reduces excitation losses caused by eddy currents.

An object of the present invention is to provide a new and improved method of making a band-shaped conductor of superconductors embedded in a normal conductor.

In accordance with the present invention, a band-shaped conductor comprises a plurality of adjacent band-shaped single conductors which are affixed to each other by electron beam welding. Each of the single conductors comprises normal electrical conducting material having a plurality of superconductors or superconducting wires embedded therein. The superconductors are spaced from the edges of the welding seams, formed between the single conductors by the electron beam welding, by at least several tenths of a millimeter.

The structure of the band-shaped conductor of the present invention permits the assembly of said conductor from a plurality of prefabricated single conductors, each of which is of less width and greater length, due to the smaller cross section of each of the single conductors. Furthermore, in multicore conductors, which are particularly suitable as the band-shaped conductors, and which preferably comprise oxygen-free copper having embedded niobium-titanium wires, the ratio between the thickness and the width of each of the single conductors may be selected to be relatively large, thereby eliminating the need for extreme deformation during the manufacture of the single conductors and therefore preventing possible considerable pressure on or pressing of the superconductors. The band-shaped conductor of the present invention thus avoids anisotropic manifestations to a considerable extent.

The electron beam welding of the single conductors to each other produces good electrical and mechanical connections between said single conductors without permitting sufficient heat to penetrate into the normal conducting material to heat the embedded superconductors to an undesirable extent. Heating of the superconductors for more than a few seconds such as, for example, 4 or 5 seconds, to a temperature of 350° C. or greater, notably decreases the critical current density of said superconductors. The spacing of the superconductors from the edges of the welding seams by at least several tenths of a millimeter prevents heat damage to said superconductors including those superconductors in close proximity with said welding seams. The edge of the welding seam is the edge of the melting zone and is clearly recognized in the structure, microstructure, texture or appearance as the end of the solidification dendrites.

A minimum space of at least five tenths of a millimeter between the superconductors and the edges of the welding seams proved to be beneficial in single conductors comprising copper having embedded niobium-titanium wires. Contrary to other methods of welding, where the heat penetration is considerably greater, in electron beam welding virtually no recrystallation region forms outside the welding seams, in the copper.

In order to prevent excessive heating of the single conductors, each of the welding seams preferably has a maximum width of 1.2 mm. and a depth which is at least equal to the width.

The edges of each of the band-shaped single conductors are preferably rounded thereby forming depressions between adjacent ones of said single conductors, and the welding seams extend into such depression. This eliminates the necessity for smoothing processes on the surface of the band-shaped conductor of the present invention after the welding process.

Depending upon the requirements for the mechanical and electrical connections between the single conductors, the welding seams may extend through the entire thickness of the band-shaped conductor or may extend for less than said thickness. When the welding seams extend to less than the thickness of the band-shaped conductor, it is possible to disassemble the band-shaped conductor, step by step, into single conductors, by breaking the welding seams by bending or compression forces. This may be undertaken for testing purposes or when there is damage to some of the single conductors. The welding seam, in such case, functions as a reference breaking point, so that during the disassembly of the band-shaped conductor, the normal conducting material of each single conductor is not subjected to cold-forming deformation which may impair its low temperature electrical conductivity. The undamaged disassembled single conductors may then be used again in another band-shaped conductor.

Each of the single conductors has a thickness perpendicular to and narrower than a pair of opposite spaced wide surfaces. The welding seams may extend from both wide surfaces.

The single conductors may be electron beam welded to a band of metal of high tensile strength, as well as to each other. The metal band is positioned in parallel with the wide surfaces of the single conductors and is welded to a corresponding one of such surfaces. The metal band may comprise, for example, stainless steel. The metal band protects the band-shaped conductor from tensile stress occurring in the winding of a magnet, which tensile strength may be considerable under certain circumstances.

One of the single conductors of the band-shaped conductor may comprise only normal conducting material, and no embedded superconductors. This permits the variation of the number of single conductors having embedded superconductors without changing the overall dimensions of the band-shaped conductor. Thus, a suitable number of single conductors may be replaced by purely normal conducting material. This permits the composition of the band-shaped conductor of the present invention to be adjusted with facility to the local magnetic field within a winding produced by the conductor. Thus, for example, when the band-shaped conductor of the present invention is utilized as a disc-shaped winding, said conductor may be designed so that the number of its component single conductors containing embedded superconductors increases toward the axis of the winding while the number of said single conductors without embedded superconductors decreases at the same rate. This results in the fact that at a homogeneous width of the band-shaped conductor in the part of the winding which is subjected to the stronger magnetic field, more superconducting material is available for transfer of the current than is available in the part of the winding which is farther from the axis of said winding and is subjected to a weaker magnetic field, where less superconducting material is required relative to the higher current transfer capacity superconductors. This results in a possible saving of considerable amounts of superconducting material.

One or more of the welding seams may be interrupted along its length. The interruption of the welding seams permits a considerable increase in the welding speed relative to the welding speed in producing continuous welding seams. Furthermore, the interruptions or gaps in the welding seams, as well as the utilization of welding seams which extend to less than the thickness of the band-shaped conductor, result in a reduction of the excitation losses caused by eddy currents when said conductor is utilized for magnetic windings. The eddy currents produced in the band-shaped conductor due to radial magnetic field components are considerably damped at the points of abutment of the single conductors unconnected by welding seams.

In accordance with the present invention, a method of making a band-shaped conductor comprises the steps of embedding a plurality of superconductors in normal conducting material to provide a single conductor, and electron beam welding a pair of adjacent single conductors to each other at welding seams therebetween with the superconductors spaced from the edges of the welding seams by at least several tenths of a millimeter. During the welding of the single conductors to each other, the single conductors are guided and pressed against each other.

In order that the present invention may be readily carried into effect, it will now be described with reference to the accompanying drawing, wherein.

In the FIGS. the same components are identified by the same reference numerals.

Figure 1:
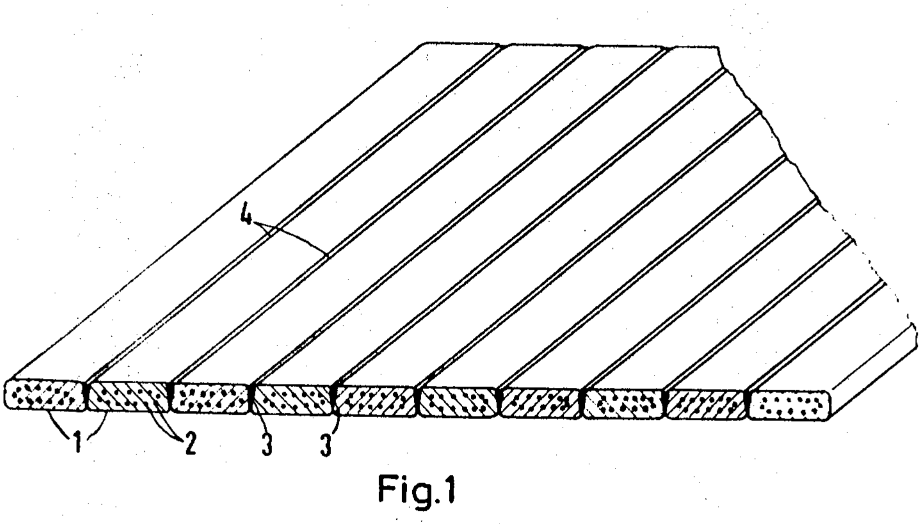
FIG. 1 is a schematic perspective view, partly in section, of an embodiment of the band-shaped conductor of the present invention.

In the embodiment of FIG. 1, the band-shaped or tape-shaped conductor of the present invention comprises 10 single conductors 1. Each of the single conductors 1 comprises normal conducting material having a plurality of superconductors or superconducting wires 2 embedded therein. Adjacent single conductors 1 are electron beam welded to each other. Welding seams 3 are formed between the adjacent single conductors 1 as a result of the welding operation in the embodiment of FIG. 1, the welding seams 3 extend through the entire thickness of the band-shaped conductor.

The thickness of the band-shaped conductor is the thickness of each of the single conductors 1 and is perpendicular to and narrower than the pair of spaced opposite wide surfaces of each of said single conductors.

In the embodiment of FIG. 1, the single conductors 1, are multicore a band-shaped conductor of normal conducting oxygen-free copper and 13 wires 2 embedded therein. The wires 2 are in spaced parallel relation to each other and each comprises a superconducting alloy of niobium and titanium in a weight ratio of 50 percent to 50 percent. Each of the single conductors 1 has a thickness of 3.0 mm. and a wide surface or width of about 9.0 mm. The entire cross section of the superconductor material embedded in a single conductor 1 is 1.25 times $10^{-2}$cm$^2$.

The edges of the single conductors 1 are slightly rounded with a radius of curvature which is approximately 0.2 to 0.5 mm. The rounded edges produce depressions 4 between adjacent single conductors 1, and the welding seams 3 terminate in said depressions.

In the embodiment of FIG. 1, the single conductors 1 were welded to each other in a high vacuum. The acceleration potential of the electron beam was thus 150 kilovolts, the beam current was 12 milliamperes, and the feed velocity of the conductors to be welded was approximately 25 mm. per second relative to the electron beam. In order to permit the joint between adjacent single conductors 1 to be reliably subjected to the electron beam, said electron beam was circularly deflected or diverted during the welding process in a manner whereby it defined a circle of approximately 0.7 mm. in diameter at the welding spot or point. The minimum space between the superconducting niobium-titanium wires 2 and the edges of the welding seams 3 was approximately 1.0 mm.

The width of the welding seams 3 in the embodiment of FIG. 1 was approximately 1.0 mm. The feed velocity for the single conductors 1 to be welded may be further increased considerably by an increase in the beam current. The band-shaped conductor of FIG. 1, comprising 10 single conductors, may carry a current exceeding 10,000 amperes in an outside magnetic field of 50 kiloersted without exceeding the critical current of the superconducting material.

Accurate tests have shown that welding by electron beam not only provides a tight or stable mutual connection of the single conductors 1 without impairing the superconducting properties of the embedded superconductors 2, but may simultaneously improve the low temperature electrical conductivity of the copper of the multicore conductor relative to its condition prior to the welding operation. In order to manufacture the multicore conductor, copper and niobium-titanium wires coated with copper, are packed together. The resulting package is then reduced to the desired dimension of the single conductor 1 by a sequence of cold-forming and heat-processing steps. The cold-forming and heat-processing steps are so selected that the critical current densities in the embedded superconductors become as high as possible and the mechanical and electrical contact between said superconductors and the copper is the best attainable.

The last process or step is usually a cold-forming process for producing an exact cross section of the single conductor. The plastic deformation of the copper, which occurs during the last process, in conjunction with the plastic deformations produced by the previous cold-forming, provided that their effect was not canceled by the various heat processes, leads to an increase in the residual resistance of the copper which is considerably greater than the level which would be naturally attained due to the quality of the copper. Due to the heat absorbed by copper during the electron beam welding operation, the negative influences of the plastic deformation may then be at least partially removed without distortion of the single conductor under the action of the inner mechanical tensions released thereby and without impairing the geometrical quality of said conductor. Furthermore, the single conductors are not heated to the extent that the superconductors are damaged.

Figure 2:
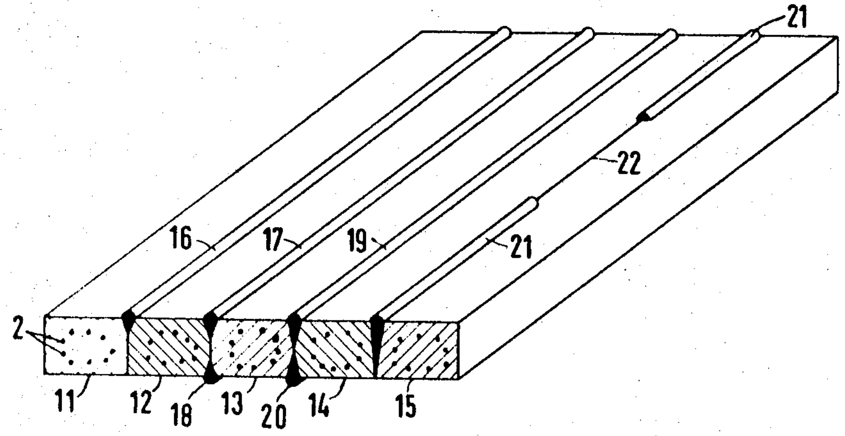
FIG. 2 is a schematic perspective view, partly in section, illustrating a plurality of modifications of the embodiment of FIG. 1.

In FIG. 2, a welding seam 16 is provided between a pair of adjacent single conductors 11 and 12. The welding seam 16 extends less than the thickness of the single conductors 11 and 12. A pair of welding seams 17 and 18, similar to the welding seam 16, and extending to the same extent as the welding seam 16, are provided on both wide surfaces of the single conductors 12 and 13 and extend therebetween.

In FIG. 2, two welding seams 19 and 20 are provided between a pair of adjacent single conductors 13 and 14 in the same manner as the welding seams 17 and 18 are provided between the single conductors 12 and 13. The difference between the welding seams 17 and 18 and the welding seams 19 and 20 is that each of the welding seams 17 and 18 extends to a depth which is less than half the thickness of the band-shaped conductor, so that there is a space between said welding seams, whereas each of the welding seams 19 and 20 extends half the said thickness so that said welding seams contact each other at the center of the band-shaped conductor. Two separate welding processes are required in order to produce the welding seams 17 and 18 and the welding seams 19 and 20.

A welding seam 21, as shown in FIG. 2, is provided between the single conductor 14 and a next-adjacent single conductor 15. The welding seam 21 extends the entire thickness of the band-shaped conductor, which is the entire thickness of each of the single conductors 14 and 15, and as do the welding seams 3 of the embodiment of FIG. 1. The welding seam 21 differs from the welding seams 3 of FIG. 1, however, since it is interrupted by a space, gap or interruption 22 along its length. In a band-shaped conductor of the dimensions of the embodiment of FIG. 1, the welding seams 21 or the gaps 22 therein may be approximately 0.5 to 2.0 cm. in length.

Figure 3:
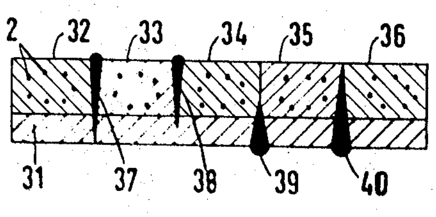
FIG. 3 is a schematic sectional view of another embodiment of the band-shaped conductor of the present invention, illustrating various modifications thereof.

The edges of the single conductors 11, 12, 13, 14 and 15 may be rounded in the same manner as the edges of the single conductors 1 of FIG. 1, so that the various welding seams may be countersunk or depressed. The various types of welding seams should be selected so that the band-shaped conductor meets the requirements set for it and also permits economical manufacture. In order to attain economical manufacture, the highest possible feed velocity or rate of feed must be provided for the single conductors which are to be welded to each other. The single conductors may be welded to a metal band, as well as to each other, by an electron beam welding process, as shown in FIG. 3. The metal band 31 of FIG. 3 may comprise a metal of high tensile strength or high stress resistance. The metal band 31 is positioned adjacent to one wide surface of the band-shaped conductor and is parallel to the wide surfaces of said band-shaped conductor, such wide surfaces being the wide surfaces of the component single conductors. The metal band 31 protects the band-shaped conductor from damage.

FIG. 3 illustrates the various ways in which the single conductors 32, 33, 34, 35 and 36 may be welded to each other and to the metal band 31. The metal band may comprise, for example, stainless steel. The single conductors 32 and 33 are welded to each other and to the metal band 31 by a welding seam 37 which extends from the free wide surfaces of said single conductors completely through the band-shaped conductor and said metal band.

A welding seam 38 between the single conductors 33 and 34 extends from the free surfaces of said single conductors completely through the band-shaped conductor, but only partly into the band 31. The single conductors 34 and 35 are affixed to each other and to the band 31 by a welding seam 39 which extends from the free surface of said band completely through said band, and partly into the band-shaped conductor. The single conductors 35 and 36 are affixed to each other and to the metal band 31 by a welding seam 40 which extends from the free surface of said band completely through said band and the band-shaped conductor. Each of the welding seams 39 and 40 is produced by an electron beam impinging upon the metal band 31.

The electron beam welding produces extremely close contact between the copper of the single conductors and the metal band 31. A partial intermixture of both materials occurs within the welding seam. In the resulting alloy regions, the electrical resistance is higher by some orders of magnitude, at low temperatures, than in the copper. This contributes toward a damping of eddy currents which may occur in the band-shaped conductor.

Figure 4:
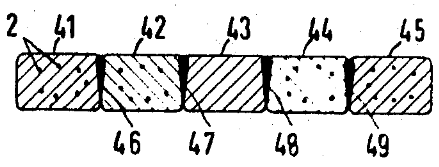
FIG. 4 is a schematic sectional view of another embodiment of the band-shaped conductor of the present invention.

In the embodiment of FIG. 4, the band-shaped conductor comprises five single conductors 41, 42, 43, 44 and 45. The single conductor 43 comprises only normal conducting material, and contains no embedded superconductors. A welding seam 46 affixes the single conductors 41 and 42. A welding seam 47 affixes the single conductors 42 and 43. A welding seam 48 affixes the single conductors 43 and 44. A welding seam 49 affixes the single conductors 44 and 45. The single conductor 43 may comprise a metal of low conductivity, rather than one of good electrical conductance. The single conductor 43 may function, for example, to protect the other single conductors from damage or to damp eddy currents.

The single conductors of the band-shaped conductor of the present invention are preferably welded in a high vacuum of $10^{-4}$Torr, for example. Suitable vacuum traps or locks must be provided for introducing the single conductors to be welded into the vacuum chamber where the electron beam is located. During the welding process, it is preferable to guide and compress the single conductors against each other with the assistance of pressure or press rollers. The band-shaped conductor may be manufactured in a manner whereby one band-shaped single conductor is welded with the next-adjacent band-shaped single conductor in sequence, until the required number of single conductors have been joined. A plurality of single conductors may first be welded into groups of band-shaped conductors and such groups may then be assembled into a final band-shaped conductor in a final welding process. Appropriately designed electron beam welding apparatus permits the single conductors to be welded in a half vacuum, of approximately $10^{-1}$ Torr, or in the atmosphere.

When the welding seams are interrupted, three single conductors may be affixed to each other, for example, during a single welding operation. The welding seams between the single conductors are preferably so positioned, in mutual dislocation, that an unwelded length between a first pair of single conductors is aligned with a welded length between a second pair of single conductors. The electron beam may be appropriately deflected, so that after the completion of one length of a welding seam between one pair of single conductors, said electron beam skips to the welding length of a second pair of single conductors and then skips back to the first pair of single conductors after the length of welding seams has been completed between said second pair of single conductors. The welding time for the manufacture of a band-shaped conductor may thus be considerably reduced.

In addition to multicore conductors of copper and niobium-titanium wires, single conductors comprising other metals having good electrical conductivity such as, for example, aluminum, containing embedded superconductors of high field superconducting materials, are also suitable for the production of the band-shaped conductor of the present invention. Suitable high field superconducting materials are niobium-zirconium and niobium-titanium alloys.

The band-shaped conductor of the present invention is particularly suitable for superconducting windings having bending radii of approximately 500 mm. or more, which are operated at currents of about 1000 amperes or more. The windings may be shaped as a disc, as hereinbefore described, or as a cylinder, an oval, or a saddle. Heat transfer from the windings may be provided by cooling the narrow sides of the band-shaped conductor or by providing channel cooling. In channel cooling, a coolant such as, for example, liquid helium, flows through ducts or channels provided between the layers of windings produced from the band-shaped conductor. In order to provide good electrical stabilization, the coolant should wet directly at least 30 percent of the total surface of the band-shaped conductor. It is preferable to provide a large cross section of the normal conducting material, relative to the cross section of the embedded superconducting material, so that said normal conducting material may absorb, if necessary, the entire current passing through the band-shaped conductor. This prevents the heating of the band-shaped conductor above the critical temperature of the superconducting material.

An electron beam welding process which may be utilized in the present invention is disclosed in Swiss Pat. No. 411,168, and in an article by J. R. King in "The Tool and Manufacturing Engineer," Oct. 1966, pages 51 to 55. The two FIGS. at the bottom of page 52 of the aforedescribed article disclose a device for welding band-shaped conductors. The FIG. on page 55 of said article illustrates a device which may simultaneously produce two welding seams by appropriate deflection of the electron beam.

While the invention has been described by means of specific examples and in specific embodiments, we do not wish to be limited thereto, for obvious modifications will occur to those skilled in the art without departing from the spirit and scope of the invention.

We claim:

1. A band-shaped conductor comprising a plurality of adjacent single conductors having electron beam welding seams therebetween and affixed to each other at said welding seams, each of said single conductors comprising normal conducting material and a plurality of superconductors embedded in said normal conducting material, said superconductors being spaced from the edges of said welding seams by at least several tenths of a millimeter.

2. A band-shaped conductor as claimed in claim 1, wherein said normal conducting material comprises copper and said superconductors comprise niobium-titanium alloy embedded in said copper.

3. A band-shaped conductor as claimed in claim 1, wherein said superconductors are spaced from the edges of said welding seams by at least five tenths of a millimeter.

4. A band-shaped conductor as claimed in claim 1, wherein each of said welding seams has a maximum width of 1.2 mm. and a depth at least equal to the width.

5. A band-shaped conductor as claimed in claim 1, wherein each of said single conductors has rounded edges thereby forming depressions between adjacent ones of said single conductors and said welding seams extend into said depressions.

6. A band-shaped conductor as claimed in claim 1, wherein each of said single conductors has a thickness perpendicular to and narrower than a pair of opposite spaced wide surfaces, and said welding seams extend through the entire thickness.

7. A band-shaped conductor as claimed in claim 1, wherein each of said single conductors has a thickness perpendicular to and narrower than a pair of opposite spaced wide surfaces, and said welding seams extend to a depth less than said thickness.

8. A band-shaped conductor as claimed in claim 1, wherein each of said single conductors has a thickness perpendicular to and narrower than a pair of opposite spaced wide surfaces, and said welding seams extend from both wide surfaces.

9. A band-shaped conductor as claimed in claim 1, further comprising a band of metal of high tensile strength, and wherein each of said single conductors has a pair of opposite spaced wide surfaces and said single conductors are affixed to each other and are affixed to said band of metal at one wide surface.

10. A band-shaped conductor as claimed in claim 1, wherein one of said single conductors comprises only normal conducting material.

11. A band-shaped conductor as claimed in claim 1, wherein one of said welding seams is interrupted along its length.

12. A method of making a band-shaped conductor, comprising:

the steps of embedding a plurality of superconductors in normal conducting material to provide a single conductor; and electron beam welding a pair of adjacent single conductors to each other at welding seams therebetween with the superconductors spaced from the edges of the welding seams by at least several tenths of a millimeter.

13. A method of making a band-shaped conductor as claimed in claim 12, further comprising electron beam welding the welded single conductors to a band of metal of high tensile strength.

14. A method of making a band-shaped conductor as claimed in claim 12, further comprising electron beam welding a plurality of adjacent single conductors to each other at welding seams therebetween.

15. A method of making a band-shaped conductor as claimed in claim 12, wherein during the welding of the single conductors to each other said single conductors are guided and pressed against each other.